United States Patent
Gil et al.

(10) Patent No.: US 9,673,796 B2
(45) Date of Patent: Jun. 6, 2017

(54) SIGNAL PROCESSING APPARATUS, AND APPARATUS AND METHOD FOR DRIVING GYRO SENSOR USING SIGNAL PROCESSING APPARATUS

(71) Applicant: Samsung Electro-Mechanics Co., Ltd., Suwon-si (KR)

(72) Inventors: Jae Hyoung Gil, Suwon-si (KR); Jun Lim, Suwon-si (KR); Yu Heon Yi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/070,759

(22) Filed: Mar. 15, 2016

(65) Prior Publication Data

US 2016/0277011 A1 Sep. 22, 2016

(30) Foreign Application Priority Data

Mar. 18, 2015 (KR) .................. 10-2015-0037318

(51) Int. Cl.
| | |
|---|---|
| H03K 3/00 | (2006.01) |
| H03H 11/16 | (2006.01) |
| H03K 5/13 | (2014.01) |
| H03K 5/135 | (2006.01) |
| H03K 5/00 | (2006.01) |

(52) U.S. Cl.
CPC ... *H03K 5/135* (2013.01); *H03K 2005/00286* (2013.01)

(58) Field of Classification Search
USPC ........................ 327/231, 237, 276
See application file for complete search history.

(56) References Cited

U.S. PATENT DOCUMENTS

| 7,224,759 B2 | 5/2007 | White |
| 2005/0189979 A1 | 9/2005 | Park |
| 2008/0218764 A1* | 9/2008 | Chen .................... G01C 19/721 356/460 |
| 2012/0031184 A1 | 2/2012 | Kim |
| 2012/0312095 A1 | 12/2012 | Hanson et al. |

(Continued)

FOREIGN PATENT DOCUMENTS

| KR | 10-0594258 B1 | 6/2006 |
| KR | 10-2012-0056907 A | 6/2012 |
| KR | 10-2015-0010493 A | 1/2015 |

OTHER PUBLICATIONS

Korean Office Action issued on May 18, 2016 in counterpart Korean Application No. 10-2015-0037318 (7 pages in English, 6 pages in Korean).

*Primary Examiner* — Adam Houston
(74) *Attorney, Agent, or Firm* — NSIP Law (57) ABSTRACT

A signal processing apparatus includes: a clock generator configured to generate a clock signal having a phase based on a phase of an input signal; a phase modulator configured to shift the phase of the clock signal to generate a phase-shifted clock signal; and a signal synthesizer configured to synthesize the phase-shifted clock signal and the input signal to generate a synthesized signal, wherein the phase modulator is configured to determine a value by which to shift the phase of the clock signal based on an amplitude of the input signal and an amplitude of noise included in the input signal.

13 Claims, 4 Drawing Sheets

(56) References Cited

U.S. PATENT DOCUMENTS

| | | | |
|---|---|---|---|
| 2013/0002038 A1* | 1/2013 | Lee | H02J 7/00 307/104 |
| 2015/0020589 A1* | 1/2015 | Kim | G01C 19/5776 73/504.12 |
| 2015/0160011 A1* | 6/2015 | Nakajima | G01C 19/5776 702/56 |
| 2015/0260755 A1* | 9/2015 | Kim | G01C 25/00 73/1.77 |
| 2016/0238391 A1* | 8/2016 | Na | G01C 19/5776 |
| 2016/0269011 A1* | 9/2016 | Uehara | H03K 5/15013 |
| 2016/0277011 A1* | 9/2016 | Gil | H03K 5/135 |
| 2016/0332493 A1* | 11/2016 | Atsumi | B60C 23/0452 |

* cited by examiner

SIGNAL PROCESSING APPARATUS, AND APPARATUS AND METHOD FOR DRIVING GYRO SENSOR USING SIGNAL PROCESSING APPARATUS

CROSS-REFERENCE TO RELATED APPLICATION

This application claims the benefit under 35 USC 119(a) of Korean Patent Application No. 10-2015-0037318 filed on Mar. 18, 2015 in the Korean Intellectual Property Office, the entire disclosure of which is incorporated herein by reference for all purposes.

BACKGROUND

1. Field

The following description relates to a signal processing apparatus, and an apparatus and a method of driving a gyro sensor using the signal processing apparatus.

2. Description of Related Art

In general, in order to improve sensitivity to a signal, a technology that improves a signal-to-noise (S/N) ratio is used. For example, by improving the S/N ratio, performance of a gyro sensor may be improved. Therefore, signal processing technology for improving the S/N ratio of gyro sensors is desirable.

A noise-concealing method using a phase difference between a phase of a signal and a phase of noise may be considered as a method for improving a S/N ratio. However, since the phase difference may not be uniform, a problem may occur in which the S/N ratio is deteriorated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a signal processing apparatus includes: a clock generator configured to generate a clock signal having a phase based on a phase of an input signal; a phase modulator configured to shift the phase of the clock signal to generate a phase-shifted clock signal; and a signal synthesizer configured to synthesize the phase-shifted clock signal and the input signal to generate a synthesized signal, wherein the phase modulator is configured to determine a value by which to shift the phase of the clock signal based on an amplitude of the input signal and an amplitude of noise included in the input signal.

The clock generator may be configured to generate the clock signal using a self-oscillation loop such that the phase of the clock signal is the same as the phase of the input signal.

The signal processing apparatus may further include a low-pass filter configured to perform low-pass filtering on the synthesized signal.

According to another general aspect, an apparatus for driving a gyro sensor includes: a clock generator configured to generate a clock signal having a phase based on a phase of a driving signal; a phase modulator configured to shift the phase of the clock signal to generate a phase-shifted clock signal; a signal synthesizer configured to synthesize the phase-shifted clock signal to generate a synthesized signal; and a low-pass filter configured to perform low-pass filtering on the synthesized signal.

The clock generator may include a phase shifter configured to phase-shift the driving signal by 90°. The phase shifter may be configured to phase-shift a feedback signal including driving displacement information of the gyro sensor by 90°, and feed back the phase-shifted feedback signal to the driving signal to generate the clock signal.

The phase modulator may include an amplifier configured to amplify the clock signal generated by the clock generator. The phase modulator may be configured to perform phase correction such that the phase of the driving signal sensed when the gyro sensor is stopped and the phase of the clock signal have a phase difference of 90°. The phase modulator may be configured to perform the phase correction such that the phase of the driving signal sensed when the gyro sensor is rotated and the phase of the clock signal have a phase difference of 0°.

The apparatus may further include a sensor configured to sense driving displacements of three axes of the gyro sensor, wherein the phase modulator is configured to independently shift the phase of the clock signal for the three axes, and the signal synthesizer is configured to synthesize corresponding components of the driving signal for the three axes with the phase-shifted clock signal.

The phase modulator may be configured to determine a value by which to shift the phase of the clock signal based on an amplitude of the driving signal and an amplitude of noise included in the driving signal.

According to another general aspect, a signal processing method includes: generating, at a clock generator, a clock signal having a phase based on a phase of an input signal; shifting, at a phase modulator, the phase of the clock signal to generate a phase-shifted clock signal; combining phase-shifted clock signal and the input signal to generate a combined signal; and performing low-pass filtering on the combined signal.

The combining of the phase-shifted clock signal and the input signal may include multiplying the phase-shifted clock signal and the input signal.

The input signal may be generated by a gyroscope.

The method may further include generating the clock signal using a self-oscillation loop.

The phase modulator may be configured to determine a value by which to shift the phase of the clock signal based on an amplitude of the input signal and an amplitude of noise included in the input signal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the disclosed embodiments.

The terminology used herein is for describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Figure 1:
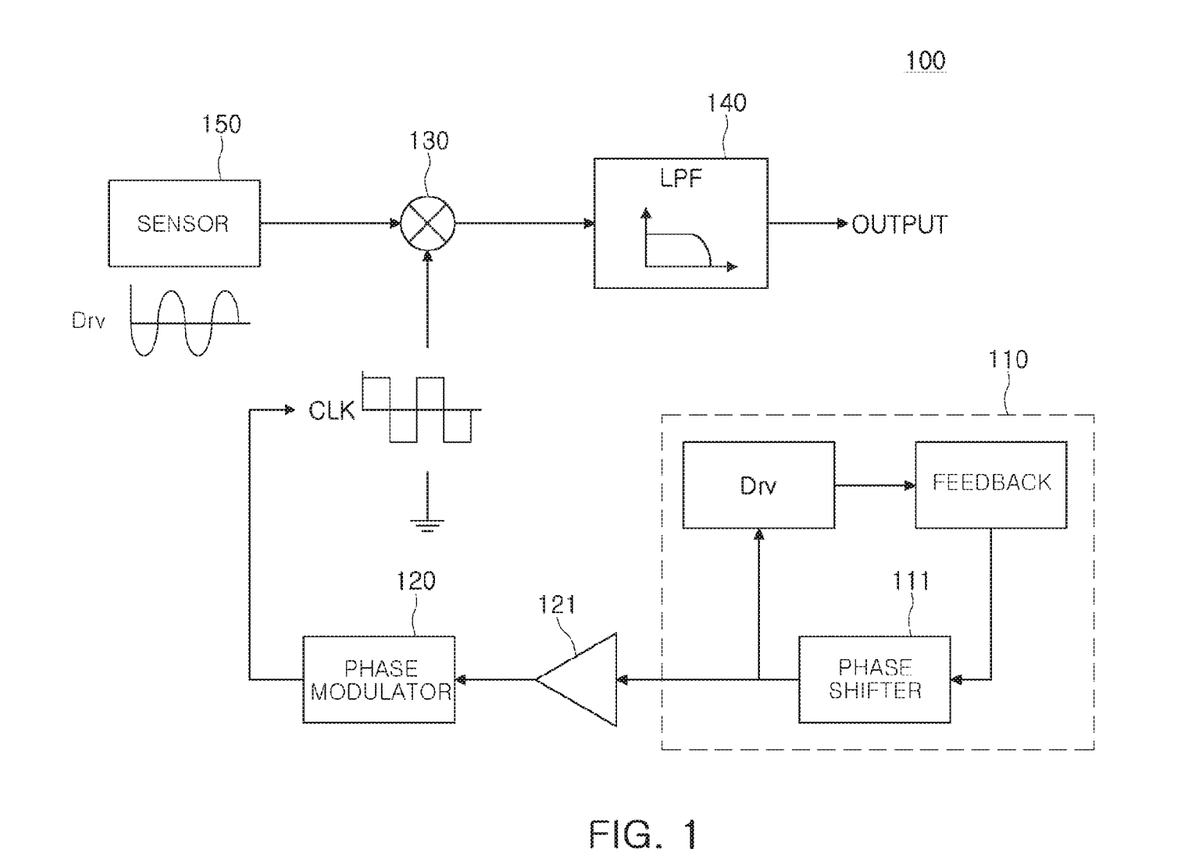
FIG. 1 is a view illustrating a signal processing apparatus, according to an embodiment.

FIG. 1 is a view illustrating a signal processing apparatus 100, according to an embodiment. Referring to FIG. 1, the signal processing apparatus 100 includes a clock generator 110, a phase modulator 120, a signal synthesizer 130, a low-pass filter 140, and a sensor 150.

The clock generator 110 determines a phase of an input signal Drv generated by the sensor 150, and generates a clock signal (hereinafter, "clock") CLK having a phase of a preset phase difference with respect to the input signal Drv.

The preset phase difference may be represented differently, depending on a reference for the phase of the input signal Drv and a reference for the phase of the clock CLK. For example, the reference for the phase of the input signal Drv may be 0° of a sin waveform, and the reference for the phase of the clock CLK may be an instant at which the phase of the clock is increased from a low value to a high value. Therefore, the preset phase difference may be 0°.

For example, the clock generator 110 generates a clock having the same phase as the phase of the input signal Drv using a self-oscillation loop. To achieve this, the self-oscillation loop feeds back the input signal Drv and phase-shifts the input signal Drv by a preset phase value. As a result, a feedback circuit operates in an unstable state to generate a clock signal.

The clock generator 110 includes a phase shifter 111 to perform the phase-shifting by the preset phase. For example, the phase shifter 111 phase-shifts the input signal Drv by 90°, and feeds back the phase-shifted input signal Drv to generate the clock CLK.

The phase modulator 120 shifts the phase of the clock generated by the clock generator 110 by a predetermined phase value and corrects the phase of the clock CLK. For example, the phase of the input signal Drv is shifted by the clock generator 110. However, due to reasons such as an occurrence condition of the clock CLK, and the like, the value of the phase shift performed by the clock generator 110 may not be changed. Therefore, the phase modulator 120 corrects a phase of a pre-generated clock, thereby efficiently correcting the phase of the clock CLK.

Further, the phase modulator 120 determines a value by which to shift the phase of the clock signal based on an amplitude of the input signal Drv and an amplitude of noise included in the input signal Drv. A detailed description of such a determination will be provided below with reference to FIG. 4.

The phase modulator 120 is connected to an amplifier 121 amplifying the clock CLK generated by the clock generator 110. The amplifier 121 amplifies the clock CLK, such that the phase modulator 120 efficiently corrects the phase of the clock CLK.

The signal synthesizer 130 synthesizes the clock CLK, having the phase corrected by the phase modulator 120, and the input signal Drv. For example, the signal synthesizer 130 is a demodulator or a mixer that receives two signals and outputs a product of the two signals. Thus, the signal synthesizer 130 multiplies the phase-corrected clock CLK and the input signal Drv to generate a synthesized signal.

In a case in which a frequency of the input signal and a frequency of the clock are the same as each other, the output of the signal synthesizer 130 is varied depending on a phase difference between the phase of the input signal Drv and the phase of the phase-corrected clock CLK. For example, in a case in which a phase difference of the input signal Drv and the phase-corrected clock CLK is 0° or 180°, the output of the synthesizer 130 is significantly increased. For example, in a case in which the phase difference of the input signal Drv and the phase-corrected clock CLK is 90° or 270°, the output of the signal synthesizer 130 is significantly decreased.

For example, the output of the signal synthesizer 130 for the input signal Drv is significantly increased, and the output of the signal synthesizer 130 for noise is significantly decreased. A detail description of such an effect will be provided below with reference to FIGS. 3 and 4.

The low-pass filter 140 performs low-pass filtering on the signal synthesized by the signal synthesizer 130. For example, a cut-off frequency of the low-pass filter 140 is lower than basic frequencies of the input signal Drv and the clock CLK. Therefore, the low-pass filter 140 outputs a direct current (DC) offset. For example, in a case in which the input signal Drv is the sensor signal, the sensing of the sensor 150 may be confirmed using the DC offset output from the low-pass filter 140.

The sensor 150 includes a sensor sensing the input signal Drv. For example, the signal processing apparatus 100 may be a sensor module connected to the sensor. Therefore, the signal processing apparatus 100, according to an embodiment, may be included in an apparatus 200 for driving a gyro sensor to be described below with reference to FIG. 2.

Figure 2:
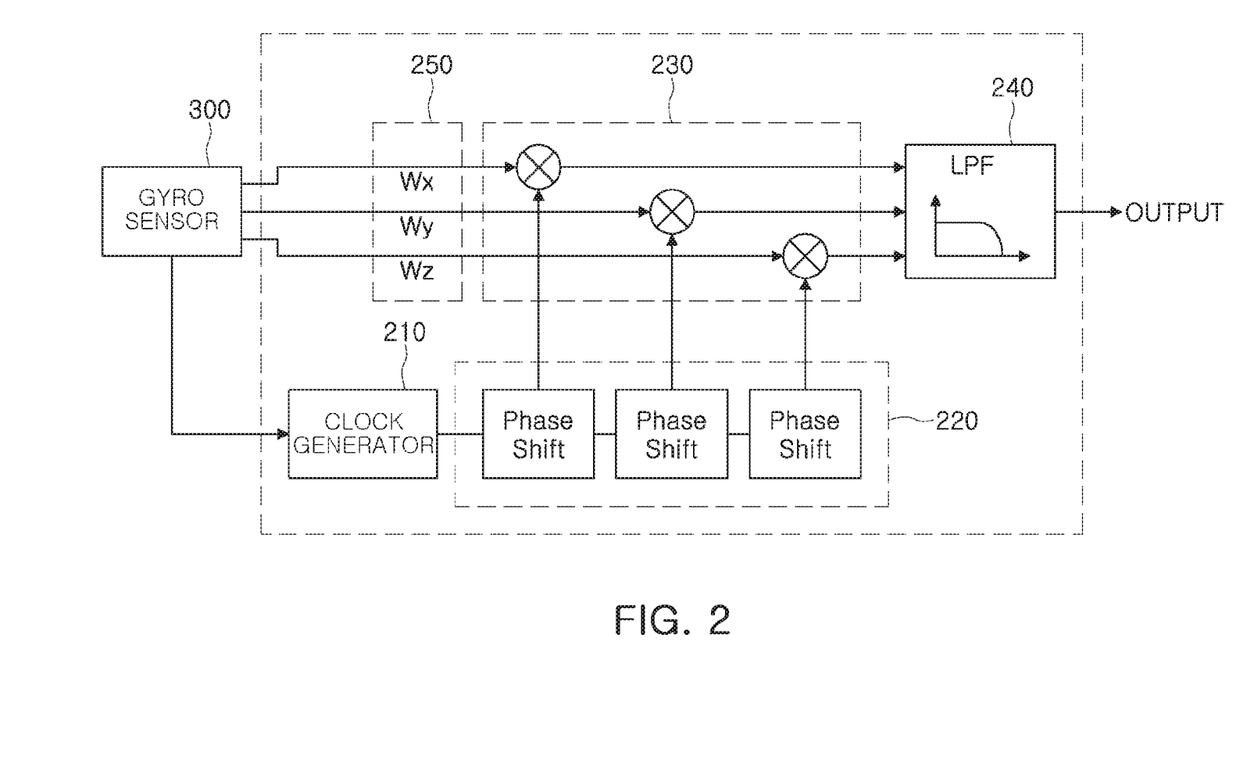
FIG. 2 is a view illustrating an apparatus for driving a gyro sensor, according to an embodiment.

FIG. 2 is a view illustrating the apparatus 200 for driving a gyro sensor, according to an embodiment. Referring to FIG. 2, the apparatus 200 includes a clock generator 210, a phase modulator 220, a signal synthesizer 230, a low-pass filter 240, and a sensor 250. Further, the apparatus 200 drives a gyro sensor 300.

The clock generator 210 determines a phase of a driving signal Drv of the gyro sensor 300 and generates a clock CLK having a phase of a preset phase difference with respect to the driving signal Drv. The driving signal Drv is, for example, a signal sensed when the gyro sensor is rotated.

The phase modulator 220 shifts a phase of the clock CLK generated by the clock generator 210 by a predetermined phase and corrects the phase of the clock CLK. For example, the phase modulator 220 corrects the phase so that a phase of the signal Drv sensed when the gyro sensor 300 is stopped and the phase of the clock CLK have a phase difference of 90°.

The signal synthesizer 230 synthesizes the clock CLK, having the phase corrected by the phase modulator 220, and the driving signal Drv in order to generate a synthesized signal.

The low-pass filter 240 performs low-pass filtering on the signal synthesized by the signal synthesizer 230.

The sensor 250 senses driving displacements of three axes Wx, Wy, and Wz of the gyro sensor 300. Thus, the driving signal Drv includes three signal components respectively corresponding to the three axes Wx, Wy, and Wz. Accordingly, the phase modulator 220 independently corrects the phase of the clock CLK for the three axes of Wx, Wy, and Wz the gyro sensor 300 to generate three respective phase-corrected clocks corresponding to the three axes Wx, Wy, and Wz. Therefore, the signal synthesizer 230 synthesizes each component of the driving signal Drv for the three axes of the gyro sensor 300 with phase-corrected clocks CLK having the phases independently corrected for the three axes.

The gyro sensor 300 may sense angular speed of a vibrating mass using Coriolis force. For example, the gyro sensor 300 may sense angular speed of a mass vibrated by the driving signal Drv. A displacement by the vibration of the gyro sensor 300 may be used in the clock generator 210.

Figure 3:
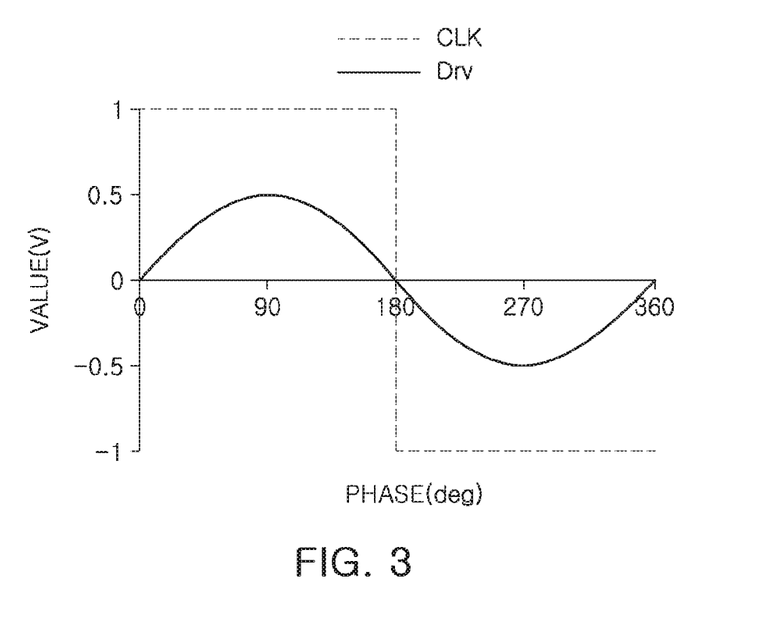
FIG. 3 is a graph illustrating a signal when the gyro sensor is rotated, and a clock, according to an embodiment.

FIG. 3 is a graph illustrating a driving signal Drv when the gyro sensor 300 is rotated, and a clock CLK. Referring to FIG. 3, the horizontal axis shows a phase (deg), and the vertical axis shows a value of the clock CLK or the signal Drv when the gyro sensor 300 is rotated. Here, a phase difference between the phase of the clock CLK and the phase of the signal Drv when the gyro sensor is rotated is 0° or 180°. Therefore, a product of the clock and the signal when the gyro sensor is rotated is significantly increased, and sensitivity is significantly increased.

Figure 4:
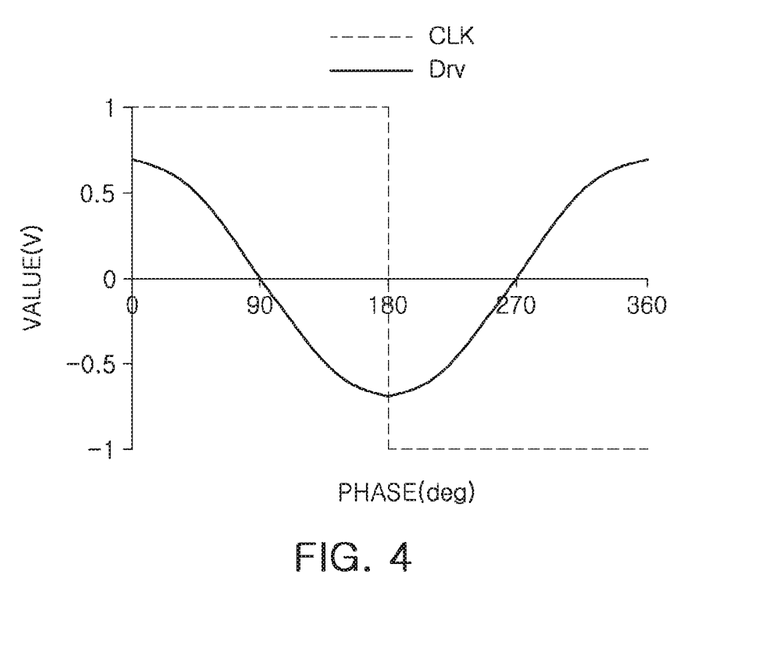
FIG. 4 is a graph illustrating a signal when the gyro sensor is stopped, and a clock, according to an embodiment.

FIG. 4 is a graph illustrating a signal when the gyro sensor 200 is stopped, and a clock CLK. Referring to FIG. 4, the horizontal axis shows a phase (deg), and the vertical axis shows a value of the clock CLK or the signal Drv when the gyro sensor 300 is stopped. Here, a phase difference between the phase of the clock and the phase of the signal when the gyro sensor is stopped is 90° or 270°. Therefore, a product of the clock and the signal when the gyro sensor is rotated is significantly decreased, and noise is significantly decreased.

Hereinafter, a relationship between the signal when the gyro sensor 300 is stopped and noise will be described. Noise is affected by signals output from the mass when the gyro sensor 300 is stopped.

As a first phenomenon, a mechanical quadrature signal presented by asymmetry of the mass, a spring, or the like affects the noise. The mechanical quadrature signal is a signal incurred because a perfectly symmetrical structure cannot be practically formed.

As a second phenomenon, a signal presented by a non-proportional damping incurred by an off-diagonal term of a damping matrix, affects the noise. Since the signal presented by the non-proportional damping has the same phase as that of Coriolis force and has a large structural influence, it may be a difficult signal to cancel.

As a third phenomenon, an electrical cross coupling signal occurring while the driving signal Drv is sensed from a sensed signal, due to the driving signal Drv electrically affecting the sensed signal, affects the noise. The electronic coupling signal may have the same phase as that of Coriolis force due to the affect by the driving signal Drv.

As a fourth phenomenon, a direct motion coupling signal incurred while the mass is directly moved by the driving signal Drv affects the noise. A difference between the direct motion coupling signal and the mechanical quadrature signal is not driving force, but force having the same phase as that of Coriolis force because the sensed mass is directly moved by the driving signal Drv.

As a fifth phenomenon, a cross-coupling in electronics phenomenon in which various signals incurred due to parasitic capacitance or inductance incurred in a circuit affect the sensed signal, affect noise. Further, the cross-coupling in electronics may exist as signals having the same phase as that of Coriolis force due to various signal components.

The remaining signals and phenomena (the second signal to the fifth phenomenon) described above except for the mechanical quadrature signal may be defined as internal and external interference signals of the sensor. A phase of the mechanical quadrature signal and a phase of the signal Drv when the gyro sensor 300 is stopped may have a phase difference of 0° or 180°. A phase of the interference signal and the phase of the signal Drv when the gyro sensor is stopped may have a phase difference of 90° or 270°.

In a case in which amplitude of the mechanical quadrature signal is greater than amplitude of the interference signal, the noise may be almost affected by the mechanical quadrature signal. Therefore, a phase difference between the phase of the signal Drv when the gyro sensor is stopped and a phase of noise may be close to 0° or 180°.

Further, in a case in which amplitude of the mechanical quadrature signal is similar to or less than amplitude of the interference signal, an influence of the mechanical quadrature signal on the noise may be small. Therefore, the phase difference between the phase of the signal when the gyro sensor is stopped and the phase of noise may be different from 0° or 180°.

Therefore, in a case in which the phase of the clock CLK is not corrected by the phase modulator 220 included in the apparatus 200, a S/N ratio of the gyro sensor 300 may be deteriorated.

Figure 5:
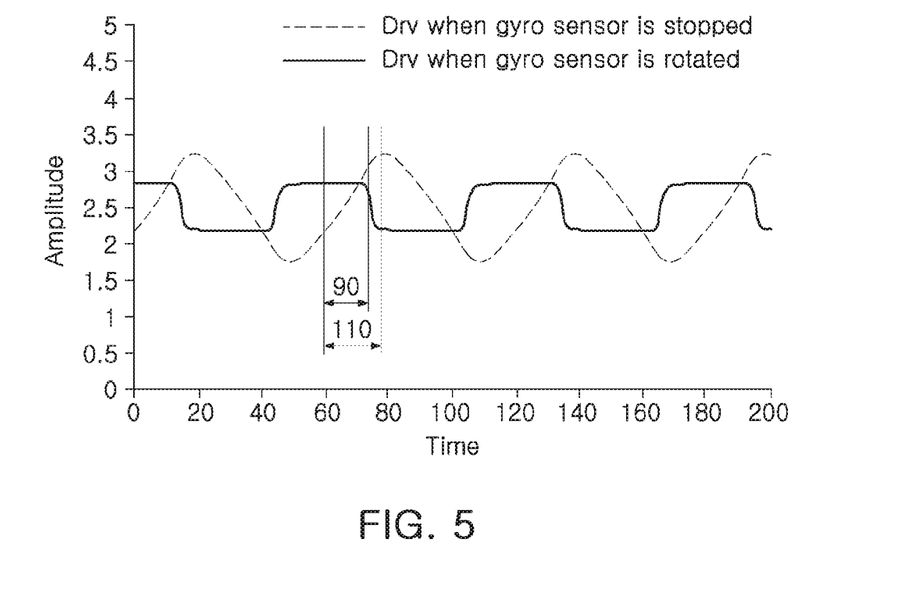
FIG. 5 is a graph illustrating a phase distortion of a signal when the gyro sensor is stopped, according to an embodiment.

FIG. 5 is a graph illustrating a phase distortion of a signal Drv when the gyro sensor 300 is stopped. Referring to FIG. 5, the horizontal axis shows a time, and the vertical axis shows values of the driving signal Drv when the gyro sensor 300 is rotated and the signal Drv when the gyro sensor is stopped. For example, a phase difference between a phase of the driving signal Drv when the gyro sensor 300 is rotated and a phase of the signal Drv when the gyro sensor 300 is stopped may be 110°. That is, FIG. 5 illustrates a case in which the phase difference between the phase of the signal Drv when the gyro sensor is stopped and the phase of noise is different from 0° or 180°.

The phase distortion is determined by the following Equation 1.

$$noise = \sqrt{\frac{1}{N}\sum_{k}^{N}\left(\frac{2}{\pi}G_1G_2(V_q\sin(P_q)\phi(t_k) - \lambda(t_k)\cos(P_q))\right)^2}$$ [Equation 1]

($A_q$: quadrature Signal Amplitude Average, $\lambda(t)$: quadrature Signal Amplitude Change $P_q$: quadrature Signal Phase Average, $\phi(t)$: quadrature Signal Phase Change)

Therefore, the phase of the clock CLK is corrected by the phase modulator 220 included in the apparatus 200, such that the S/N ratio of the gyro sensor 300 is improved.

For example, in a case in which the phase modulator 200 shifts the phase by 15° to 30°, sensitivity may be increased to a maximum of 30%. For example, in a case in which the phase modulator 200 shifts the phase by 15° to 30°, noise may be decreased to a minimum of 30%.

For example, in a case in which the phase modulator 200 shifts the phase by 15° to 30°, noise density may be decreased to a maximum of 70%.

As set forth above, according to the embodiments disclosed herein, the S/N ratio of a gyro sensor may be improved.

The apparatuses, units, modules, devices, and other components (e.g., the clock generators 110 and 210, the phase shifter 111, the amplifier 121, the phase modulators 120 and 220, the synthesizers 130 and 230, the LPFs 140 and 240, the sensors 150 and 250 and the gyro sensor 300) illustrated in FIGS. 1 and 2 that perform the operations described herein are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1 and 2. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams illustrated in the drawings and the corresponding descriptions in the specification, which disclose algorithms for performing the operations performed by the hardware components as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A signal processing apparatus comprising:
a clock generator configured to generate a clock signal having a phase based on a phase of an input signal;
a phase modulator configured to shift the phase of the clock signal to generate a phase-shifted clock signal; and
a signal synthesizer configured to synthesize the phase-shifted clock signal and the input signal to generate a synthesized signal,
wherein the phase modulator is configured to determine a value by which to shift the phase of the clock signal based on an amplitude of the input signal and an amplitude of noise included in the input signal.

2. The signal processing apparatus of claim 1, wherein the clock generator is configured to generate the clock signal using a self-oscillation loop such that the phase of the clock signal is the same as the phase of the input signal.

3. The signal processing apparatus of claim 1, further comprising a low-pass filter configured to perform low-pass filtering on the synthesized signal.

4. An apparatus for driving a gyro sensor, the apparatus comprising:
a clock generator configured to generate a clock signal having a phase based on a phase of a driving signal;
a phase modulator configured to shift the phase of the clock signal to generate a phase-shifted clock signal;
a signal synthesizer configured to synthesize the phase-shifted clock signal to generate a synthesized signal; and
a low-pass filter configured to perform low-pass filtering on the synthesized signal.

5. The apparatus of claim 4, wherein:
the clock generator comprises a phase shifter configured to phase-shift the driving signal by 90°; and
the phase shifter is configured to phase-shift a feedback signal including driving displacement information of the gyro sensor by 90°, and feed back the phase-shifted feedback signal to the driving signal to generate the clock signal.

6. The apparatus of claim 4, wherein:
the phase modulator includes an amplifier configured to amplify the clock signal generated by the clock generator;
the phase modulator is configured to perform phase correction such that the phase of the driving signal sensed when the gyro sensor is stopped and the phase of the clock signal have a phase difference of 90°; and
the phase modulator is configured to perform the phase correction such that the phase of the driving signal sensed when the gyro sensor is rotated and the phase of the clock signal have a phase difference of 0°.

7. The apparatus of claim 4, further comprising a sensor configured to sense driving displacements of three axes of the gyro sensor,
wherein the phase modulator is configured to independently shift the phase of the clock signal for the three axes, and
wherein the signal synthesizer is configured to synthesize corresponding components of the driving signal for the three axes with the phase-shifted clock signal.

8. The apparatus of claim 4, wherein the phase modulator is configured to determine a value by which to shift the phase of the clock signal based on an amplitude of the driving signal and an amplitude of noise included in the driving signal.

9. A signal processing method, comprising:
generating, at a clock generator, a clock signal having a phase based on a phase of an input signal;
shifting, at a phase modulator, the phase of the clock signal to generate a phase-shifted clock signal;
combining phase-shifted clock signal and the input signal to generate a combined signal; and
performing low-pass filtering on the combined signal.

10. The method of claim 9, wherein the combining of the phase-shifted clock signal and the input signal comprises multiplying the phase-shifted clock signal and the input signal.

11. The method of claim 9, wherein the input signal is generated by a gyroscope.

12. The method of claim 9, further comprising generating the clock signal using a self-oscillation loop.

13. The method of claim 9, wherein the phase modulator is configured to determine a value by which to shift the phase of the clock signal based on an amplitude of the input signal and an amplitude of noise included in the input signal.

* * * * *